United States Patent [19]

Ho et al.

[11] 4,070,687
[45] Jan. 24, 1978

[54] COMPOSITE CHANNEL FIELD EFFECT TRANSISTOR AND METHOD OF FABRICATION

[75] Inventors: Irving Tze Ho; Jacob Riseman, both of Poughkeepsie, N.Y.

[73] Assignee: International Business Machines Corporation, Armonk, N.Y.

[21] Appl. No.: 803,712

[22] Filed: June 6, 1977

Related U.S. Application Data

[63] Continuation of Ser. No. 645,771, Dec. 31, 1975, abandoned.

[51] Int. Cl.² .................... H01L 29/78; H01L 29/34
[52] U.S. Cl. ...................................... 357/23; 357/54; 357/91
[58] Field of Search ........................ 357/23, 54, 91; 340/173

[56] References Cited

U.S. PATENT DOCUMENTS

| | | | |
|---|---|---|---|
| 3,745,425 | 10/1973 | Beale et al. | 357/23 |
| 3,806,773 | 4/1974 | Watanabe | 357/23 |
| 3,877,055 | 4/1975 | Fisher et al. | 357/23 |
| 3,883,372 | 5/1975 | Lin | 357/23 |
| 3,909,320 | 9/1975 | Gauge et al. | 357/23 |
| 3,950,738 | 4/1976 | Hayashi et al. | 357/23 |
| 3,950,777 | 4/1976 | Tarui et al. | 357/23 |
| 3,996,655 | 12/1976 | Cunningham | 357/23 |

OTHER PUBLICATIONS

IBM Technical Disclosure Bulletin, Metal-Oxide Semiconductor Field effect Transistor Structure by Young vol. 17 No. 4, Sept. 1974, pp. 1208 and 1209.

*Primary Examiner*—Andrew J. James
*Attorney, Agent, or Firm*—James M. Thomson

[57] ABSTRACT

An improved composite channel field effect transistor and method of fabrication, which exhibits high density characteristics and yields high performance with less sensivity to threshold shift due to hot electrons when operated at high source to drain voltage levels.

4 Claims, 6 Drawing Figures

COMPOSITE CHANNEL FIELD EFFECT TRANSISTOR AND METHOD OF FABRICATION

This is a continuation of application Ser. No. 645,771, filed Dec. 31, 1975, now abandoned.

BACKGROUND OF THE INVENTION

1. Field of the Invention

The present invention relates to an improved composite channel field effect transistor and method of fabrication. More particularly, the invention relates to a composite channel field effect transistor which is less susceptible to failure due to threshold voltage shifts caused by hot electron effect when the device is operated at a high source to drain voltage level especially when composite layers of $SiO_2$—$Si_3N_4$ are employed as the insulated gate dielectric.

2. Description of the Prior Art

Various enhancement mode and depletion mode insulated gate field effect transistor designs are known in the art, and the electrical characteristics of such devices are well known. For example, U.S. Pat. No. 3,745,425 to Beale et al describes a typical insulated gate field effect semiconductor device generally consisting of a monocrystalline semiconductor body of high bulk resistivity of one conductivity type having two low resistivity surface regions of the other conductivity type spaced apart in the body and forming two rectifying junctions with the bulk region of the body. A conductive layer is formed under a dielectric layer located on top of the surface of the body, the conductive layer extending between the two surface regions. Ohmic contacts are made to the low resistivity surface regions and the conductive layer. The dielectric layer is usually produced by oxidation of the semiconductor body.

Insulated gate field effect transistors fabricated as described above, can be operated in either depletion mode or enhancement mode in well known fashion. In either case, when the devices are operated at a source to drain voltage of relatively high magnitude, such as for example, larger than three to four volts, it has been recognized that hot electrons (hot electrons in an n-channel configuration and hot holes in p-channel configurations) are produced in the depletion region of the drain electrode which may possibly penetrate the silicon dioxide layer after redirection due to collision. A high incidence of this phonomena known as the hot electron effect can cause failure in the operation of the device due to threshold voltage shift.

Accordingly, a need exists in the prior art for an improved field effect transistor which is not subject to threshold voltage shift when operated at relatively high source to drain voltage levels.

SUMMARY OF THE INVENTION

Accordingly, it is an object of the present invention to provide an improved composite channel field effect transistor, and method of fabrication thereof, which exhibits high density characteristics and yields high performance, with less sensitivity to threshold voltage shifts caused by the hot electron effect when the transistor is operated at source to drain voltage levels in the order of 3 to 4 volts or above.

This object and other features of the invention are attained with an insulated gate field effect transistor which is provided with a channel construction which comprises a composite of three regions of the same conductivity type material, but with one region having a different doping density than the other two regions and the former region separating the latter two regions. In operation the composite channel device functions as a short channel device in conventional operation since the end regions are depleted and the effective length is reduced. When operated at relatively high drain to source voltages hot electrons still penetrate into the silicon dioxide layer near the drain electrode. However, any shifting of the threshold voltage at the end portions of the channel does not effect the overall device operation unless the voltage shift is of such a high magnitude that it exceeds the threshold voltage of the center portion of the device. Accordingly, the device provides satisfactory characteristics while exhibiting significant resistance to threshold voltage shift.

BRIEF DESCRIPTION OF THE DRAWINGS

Other objects features and advantages of the invention will become apparent from the following detailed description taken in conjunction with the accompanying drawings wherein.

DETAILED DESCRIPTION OF THE INVENTION

Figure 1:
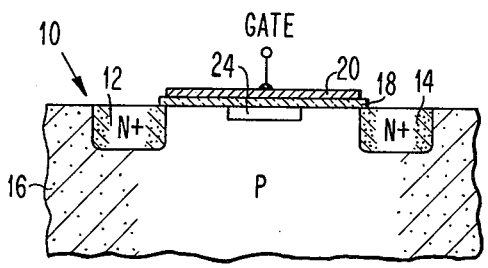
FIG. 1 is a view in section of a device constructed in accordance with the invention.

Referring now to the drawings and particularly FIG. 1 an insulated gate field effect transistor 10 is generally illustrated including source and drain electrodes 12, 14 respectively formed in a substrate 16. In the embodiment illustrated the substrate is a P— semiconductor material and the source and drain are N+ regions diffused therein in conventional fashion. A dielectric layer 18 formed of silicon dioxide, for example, is formed on the surface of the substrate extending over the channel region of the device and over extending the source and drain regions, as illustrated. A conductive layer 20 of aluminum or other suitable electrode material is formed upon layer 18, again in conventional fashion. Ohmic contacts can be attached to the drain source and gate regions in the usual fashion to operate the device in electronic circuitry. Such electrodes are not illustrated and being conventional, form no part of the invention.

A P region 24 is illustrated in FIG. 1 located at the center of the channel area of the device and acting to sub-divide the otherwise P— channel region. The P region of the device can be fabricated by use of an ion implantation step at an appropriate stage in the fabrication of the device. Such a step would be carried out by a masking operation separate from that utilized in fabricating the N regions 12, 14.

Figure 2:
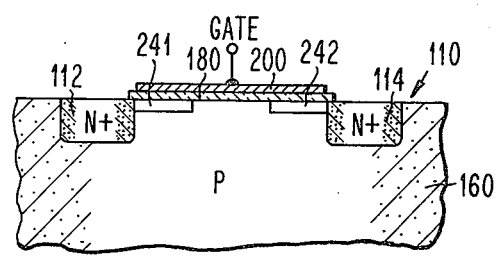
FIG. 2 is a view in section of an alternative embodiment of the invention.

Referring now to FIG. 2, a profile of an alternative embodiment of the device in FIG. 1 is illustrated. In the embodiment of FIG. 2, an insulated gate field effect transistor 110 is illustrated having a source region 112 and a drain region 114 formed in a substrate 160. In the embodiment of FIG. 2 the substrate 160 is formed of P type semiconductor material and the source and drain regions are N+ surface regions formed therein, again by conventional technique. In similar fashion an insulating layer 180 of silicon dioxide is provided on the upper surface of substrate 160 extending over the channel region of the device and over extending the drain and source regions as illustrated. A gate electrode 200 is also provided formed on the upper surface of layer 180 and being comprised of aluminum or other suitable electrode material. The embodiment of FIG. 2 differs from the embodiment of FIG. 1 only in that two P− inserts or regions 241, 242 are provided in the channel region of the device. Again, these regions could be fabricated by a separate ion implantation step at an appropriate stage in the manufacture of the device.

Figure 3:
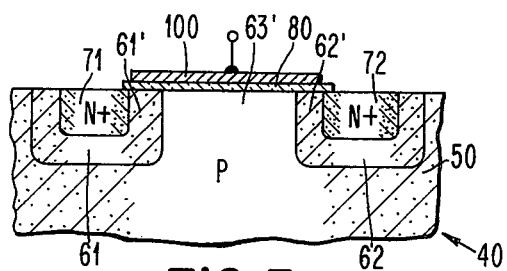
FIG. 3 is a view in section of yet another alternative embodiment of the invention.

Referring now to FIG. 3 a profile of yet another alternative embodiment of the device of FIG. 1 is illustrated. In FIG. 3 a transistor 40 is illustrated having an N source region 71 and an N drain region 72 formed in a P substrate 50. A silicon dioxide layer 80 is provided on the upper surface of substrate 50 extending over the channel region of the device and over-extending the drain and source regions as illustrated. A gate electrode 100 is also provided, formed on the upper surface of layer 80, comprised of aluminum, for example. P− regions 61, 62 are provided surrounding N regions 71, 72 respectively whereby the center of the channel region 63' comprises a P region flanked by two P− regions, indicated as 61' and 62' respectively.

It also should be recognized that the devices of FIGS. 1 and 2 are similar in that each includes a composite channel comprised of two P-regions arranged on either side of a P region. Furthermore the device of FIG. 3 includes a channel region equivalent to that of the devices of FIG. 1 and 2, and operates in similar fashion. It is possible that the devices of FIGS. 1-3 be operated with the P− regions in depletion mode, i.e. in a current carrying state in the absence of a signal applied to the gate of the device. However, it is preferred to operate the regions in an enhancement mode with a very low threshold voltage. The P region is operated in conventional enhancement mode state. It is necessary, in the event that the P− regions are operated in an enhancement mode state that the threshold voltage of the P− regions be significantly different from the threshold voltage of the P region or determined by the relative doping densities of the respective regions. If that relationship is established then the devices of FIGS. 1-3 function as a short channel device in conventional operation, i.e. the P− regions will be depeleted upon application of an appropriate signal and the P region will function in conventional fashion whereby the overall device functions as a short channel device. With drain to source voltages above the three volt level, hot electrons may still penetrate the $SiO_2$ layer near the drain electrode. However, the shifting of the threshold voltage in the P− portion of the channel adjacent the drain electrode will not effect the overall operation of the device until the threshold shift in that region becomes larger than the threshold voltage of the P region. Accordingly, the device exhibits improved operating characteristics when drain to source voltages of relatively high level are utilized.

It should also be recognized that, due to the symmetry of the devices, the composite channel configurations of FIGS. 1-3 are operable irregardless of which electrode is selected to be the source and which electrode is selected to be the drain. This is particularly advantageous because in many applications the source and drain electrodes may exchange their rolls with some degree of frequency.

Figure 4:
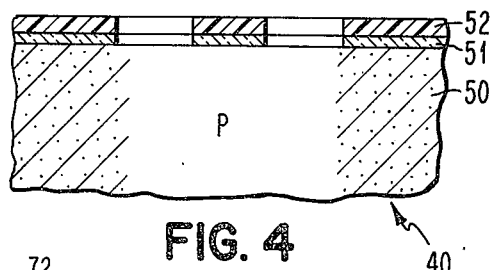
FIG. 4 is a view in section of an intermediate fabrication stage of the device illustrated in FIG. 3.

A novel method for fabricating the device illustrated in FIG. 3 is described hereinafter in connection with FIGS. 4-5. Referring now to FIG. 4 a P substrate 50 is utilized for N channel devices. In the usual fashion, an oxide layer 51 and a photo-resist layer 52 are formed and windows are opened for source and drain diffusions as illustrated in FIG. 4. Both arsenic and phosphorous are introduced through the source and drain openings by diffusion. Also ion implantation, or the doped oxide method can be used followed by a heat cycle whereby diffusion of these materials into the silicon substrate is effected. In well known fashion the diffusion profiles for the arsenic and phosphorous ions are controlled by temperature and duration of the heat cycle and by appropriate selection of doping densities. By proper control of these parameters it should be recognized that the N type phosphorus material will diffuse into the P type substrate causing regions 61, 62 as illustrated in FIG. 4 to become P−. At the same time, the combination of phosphorous and arsenic diffusion into regions 71, 72 will cause the latter regions to become N+ regions. Accordingly, upon removal of the photo-resist and silicon dioxide layers the P substrate is left with N+ source and drain regions 71, 72 respectively separated by a channel region. It should also be apparent that the channel region is comprised of P− regions 61', 62' which extend to the surface of the substrate in the channel region and are separated by a P region, such as that indicated by 63' which is unaffected by diffusion. Accordingly, the profile of a device having a channel the same as that illustrated in FIG. 3 has been defined, i.e. a pair of N+ source and drain regions separated by a composite channel structure including two P− regions and a P region separating the latter. In a preferred embodiment of FIGS. 3-5, a P substrate having a resistivity of 1 ohm-centimeter can be utilized, wherein arsenic of a density of $1 \times 10^{20}$ atoms/cm$^3$ and phosphorous of about the same density, are diffused, followed by a heat cycle of about 1050° C for about 90 minutes.

After removal of the silicon dioxide and photo-resist layers, the gate structure of the device illustrated in FIG. 3 can be fabricated utilizing conventional steps whereby a completed device is produced.

Figure 5:
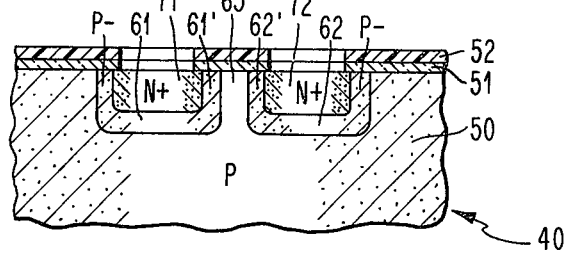
FIG. 5 is a view in section of another intermediate fabrication stage of the device illustrated in FIG. 3.
Figure 6:
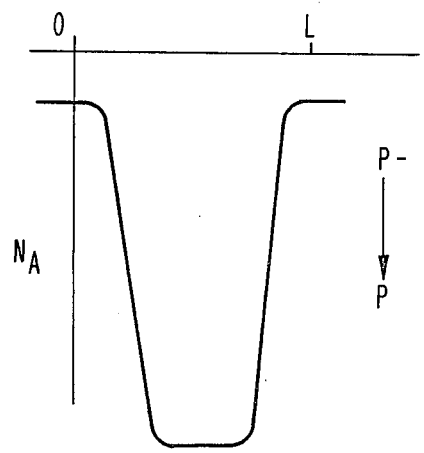
FIG. 6 is a schematic representation of the doping levels of a device such as that illustrated in FIG. 1.

The device of FIG. 1 when fabricated, can easily be manufactured to have a desired doping profile, such as that illustrated in FIG. 5, where L represents the channel length, which will yield P− regions adjacent the drain and source having very low threshold voltages when operated in enhancement mode and the P region can be fabricated to have a relatively high voltage threshold for operation in the enhancement mode whereby the device operates in the desired fashion with relatively high drain to source voltages. The devices of FIGS. 2 and 3, since they are formed of P substrates, would have slightly different doping profiles, but the effective relationship in resistivity would remain the same. The method described is particularly advantageous in that it permits fabrication of a composite channel field effect transistor with high density without introducing additional steps in the fabrication sequence.

What is claimed is:

1. A composite channel insulated gate field effect transistor with low sensitivity to threshold shifts caused by hot electrons when operated at high drain voltage levels consisting of:

a conductive substrate of one conductivity type having first and second spaced apart regions of another conductivity type formed therein defining source and drain regions having a channel region there between at the surface of said substrate, said channel region including third and fourth regions of said one conductivity type separated by a fifth region also of said one conductivity type, with said third and fourth regions having different resistivity and different impurity concentration than said fifth region;

wherein the doping level of the third and fourth regions is such that, during operation of the device at drain voltage levels above the 3-4 volt range, the P-N junction depletion width at the drain electrode does not extend beyond the bounds of said third or fourth regions; and a dielectric layer on the surface of said substrate extending between the source and drain regions and a conductive layer upon said dielectric layer.

2. The field effect transistor as recited in claim 1, wherein said substrate is formed of P material, said source and drain regions are formed of N material and wherein said third and fourth regions are formed of P− materials separated by said fifth region formed of P material.

3. The transistor as recited in claim 1, wherein said substrate is formed of P− material, said source and drain regions are formed of N material and wherein said third and fourth regions are formed of P− materials separated by said fifth region of P material.

4. The transistor of claim 3 wherein said third and fourth regions surround said drain and source regions, respectively.

* * * * *